(12) United States Patent
Degawa et al.

(10) Patent No.: US 8,402,635 B2
(45) Date of Patent: Mar. 26, 2013

(54) METHOD OF MANUFACTURING A MAGNETIC HEAD INCLUDING SHIELD LAYERS WHICH SURROUND A MR ELEMENT

(75) Inventors: Naomichi Degawa, Tokyo (JP); Takumi Yanagisawa, Tokyo (JP); Satoshi Miura, Tokyo (JP); Yoshikazu Sawada, Tokyo (JP); Takahiko Machita, Tokyo (JP); Kenzo Makino, Tokyo (JP); Takekazu Yamane, Tokyo (JP); Shohei Kawasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 66 days.

(21) Appl. No.: 13/052,674

(22) Filed: Mar. 21, 2011

(65) Prior Publication Data

US 2012/0240390 A1   Sep. 27, 2012

(51) Int. Cl.
 *G11B 5/127* (2006.01)
 *H04R 31/00* (2006.01)
(52) U.S. Cl. ............... 29/603.14; 29/603.13; 29/603.15; 29/603.16; 29/603.18; 216/62; 216/65; 216/66; 360/324.1; 360/324.11; 360/324.12; 360/324.2
(58) Field of Classification Search ............... 29/603.07, 29/603.13–603.16, 603.18; 216/62, 65, 66; 360/324.1, 324.2, 324.11, 324.12; 451/5, 451/41
See application file for complete search history.

(56) References Cited

U.S. PATENT DOCUMENTS

| | | | |
|---|---|---|---|
| 7,599,151 B2 | 10/2009 | Hatatani et al. | |
| 7,639,456 B2* | 12/2009 | Hong et al. | 360/324.1 |
| 7,817,381 B2 | 10/2010 | Ohta et al. | |
| 8,089,734 B2* | 1/2012 | Miyauchi et al. | 360/319 |
| 2005/0157431 A1 | 7/2005 | Hatatani et al. | |
| 2005/0270702 A1 | 12/2005 | Komagaki et al. | |
| 2010/0027168 A1* | 2/2010 | Chou et al. | 360/319 |

\* cited by examiner

*Primary Examiner* — Paul D Kim
(74) *Attorney, Agent, or Firm* — Posz Law Group, PLC (57) ABSTRACT

A method of manufacturing a magnetic head, including a magneto resistance effect (MR) element that reads a magnetic recording medium, is disclosed. A multilayer film is formed on a shield layer. Unnecessary portions of the multilayer film are removed from both sides of the MR element in a first direction orthogonal to a lamination direction of the multilayer film and parallel to the MR element surface facing the magnetic recording medium. An insulating layer is formed on a surface exposed by removal of the unnecessary portions. An integrated soft magnetic layer covering both sides of the MR element in the first direction and an upper side of the MR element is formed, thereby configuring a second shield layer. An anisotropy application layer is formed on the second shield layer, thereby providing exchange anisotropy to the soft magnetic layer, and magnetizing the soft magnetic layer in a predetermined direction.

13 Claims, 7 Drawing Sheets

METHOD OF MANUFACTURING A MAGNETIC HEAD INCLUDING SHIELD LAYERS WHICH SURROUND A MR ELEMENT

TECHNICAL FIELD

The present invention relates to a method of manufacturing a magnetic head and particularly to a method of manufacturing a thin film magnetic head including shield layers which surround a magneto resistance effect (MR) element.

BACKGROUND

As a reading element of a thin film magnetic head, an MR element configured with a multilayer film has been known. Conventionally, a current in plane (CIP) element where a sense current flows in a direction within a film plane has been mostly utilized. Recently, in order to correspond further high density recording, a current perpendicular to the plane (CPP) element where a sense current flows in a direction orthogonal to a film surface has been developed. As this type of element, a tunnel magneto-resistance (TMR) element to which a TMR effect is used and a CPP-giant magneto resistance (GMR) element to which a GMR effect is used are known.

An example of the GMR element or the TMR element is an element provided with a spin valve film (hereinafter, referred to as a SV film). The SV film is a multilayer film including a pinning layer, a pinned layer, a spacer layer and a free layer. The pinned layer is a ferromagnetic layer of which a magnetization direction is pinned against an external magnetic field. The free layer is a ferromagnetic layer of which a magnetization direction changes according to an external magnetic field. The spacer layer is sandwiched between the pinned layer and the free layer. The pinning layer is disposed for pinning the magnetization direction of the pinned layer, and typically is configured with an anti-ferromagnetic layer. The SV film is sandwiched by a pair of shields that are electrodes for supplying a sense current.

In a typical MR element, as disclosed in U.S. Pat. No. 7,817,381B2, hard magnetic layers are disposed on both sides of a SV film in a track width direction with insulating films therebetween. The hard magnetic layer is referred to as a bias magnetic layer. This bias magnetic layer applies a bias magnetic field to the free layer to change the free layer to a single magnetic domain. Changing the free layer to a single magnetic domain increases a linearity of a resistance change according to the change of an external magnetic field and also is advantageous for suppressing the Barkhausen noise. The magnetization direction of the bias magnetic layer is pinned in the track width direction. In the present specification, the track width direction means a direction parallel to a direction that defines a track width of a recording medium when a slider including the MR element faces the recording medium.

However, in correspondence with the improvement of a recording density of recent magnetic recording media, a side reading problem, which a magnetic head reads magnetic information leaking from adjacent tracks, occurs.

In order to cope with the side reading problem, U.S. Patent Application Publication No. 2005/0270702A1 discloses a thin film magnetic head provided with soft magnetic layers on both sides of an MR element in the track width direction. Since a soft magnetic material absorbs a magnetic flux from adjacent tracks, a noise effect due to the magnetic flux from the adjacent tracks is suppressed. As a result, a thin film magnetic head that is compatible with a recording medium of high recording density can be provided.

However, the soft magnetic layer has no function that applies a bias magnetic field to the MR element. Accordingly, in U.S. Patent Application Publication 2005/0270702A1, the MR element includes two free layers of which magnetization directions change according to an external magnetic field and an antiferromagnetic coupling layer disposed between the free layers, and the antiferromagnetic coupling layer let one free layer and the other free layer antiferromagnetically interact to each other. With such a structure, the antiferromagnetic coupling layer provides a self bias function to both of the free layers. However, with such a bias function, sufficient bias is occasionally not applied to the free layers. Further, since only specific materials can be used for the antiferromagnetic coupling layer as a spacer, it becomes difficult to improve the performance of the MR element.

As described above, it is difficult to apply sufficient bias to the free layers while the function of side shield is maintained. As a result, a thin film magnetic head that can apply sufficient bias to the free layers while the function of the side shield is maintained and a method of manufacturing the thin film magnetic head are desired to provide.

SUMMARY

A method of manufacturing a magnetic head of the present invention relates to a method of manufacturing a magnetic head that includes a magneto resistance effect (MR) element of which an electrical resistance changes according to an external magnetic field and shield layers surrounding the MR element, and that reads information of a magnetic recording medium. The manufacturing method includes a first step of forming a multilayer film including a plurality of layers configuring the MR element on a first shield layer; a second step of removing unnecessary portions of the multilayer film positioned on both sides in a first direction that is orthogonal to a lamination direction of the multilayer film and that is parallel to a plane that is to be a surface facing the magnetic recording medium so as to configure the MR element; a third step of forming an insulating layer on a surface exposed by removing the unnecessary portions; a fourth step of forming a soft magnetic layer covering the MR element in an integrated manner at once on both sides of the MR element and the insulating layer in the first direction and on the MR element so as to configure a second shield layer including the soft magnetic layer; and a fifth step of forming an anisotropy application layer on the second shield layer, the anisotropy application layer providing exchange anisotropy to the soft magnetic layer so as to magnetize the soft magnetic layer in a predetermined direction.

In the magnetic head manufactured by the above-described method, the anisotropy application layer provides exchange anisotropy to the soft magnetic layer configuring the second shield layer so as to magnetize the soft magnetic layer in a predetermined direction. The soft magnetic layer obtains the function that applies a bias magnetic field to the MR element by being magnetized in the predetermined direction.

Specifically, since the soft magnetic layer is formed at once, an oxide film, which may be generated due to a contact with air, is not generated in a center portion of the soft magnetic layer. Therefore, sufficient anisotropy is provided to portions of the soft magnetic layer on both sides of the MR element. Thereby, the strength and/or direction of a bias magnetic field applied to the MR element are/is improved.

Also, a magnetic field applied to both sides of the MR element in the above-described first direction is effectively absorbed by the soft magnetic layer on both sides of the MR element and the soft magnetic layer on an upper side of the MR element. With such a structure, the function that shields a magnetic field on the both sides of the MR element in the above-described first direction is maintained.

Note, when the magnetic head reads magnetic information of the hard disk, the above-described first direction corresponds to the track width direction defining a track width of the hard disk.

The above description, as well as other objects, features, and advantages of the present invention will be evident by the description that follows below with reference to attached drawings exemplifying the present invention.

DETAILED DESCRIPTION OF THE INVENTION

Hereinafter, an explanation regarding one embodiment of the present invention is given with reference to the drawings. A thin film magnetic head that reads information of a hard disk is explained in an embodiment, which is described below; however, the present invention can be applied to a magnetic head that reads information of an arbitrary magnetic recording medium.

Figure 1:
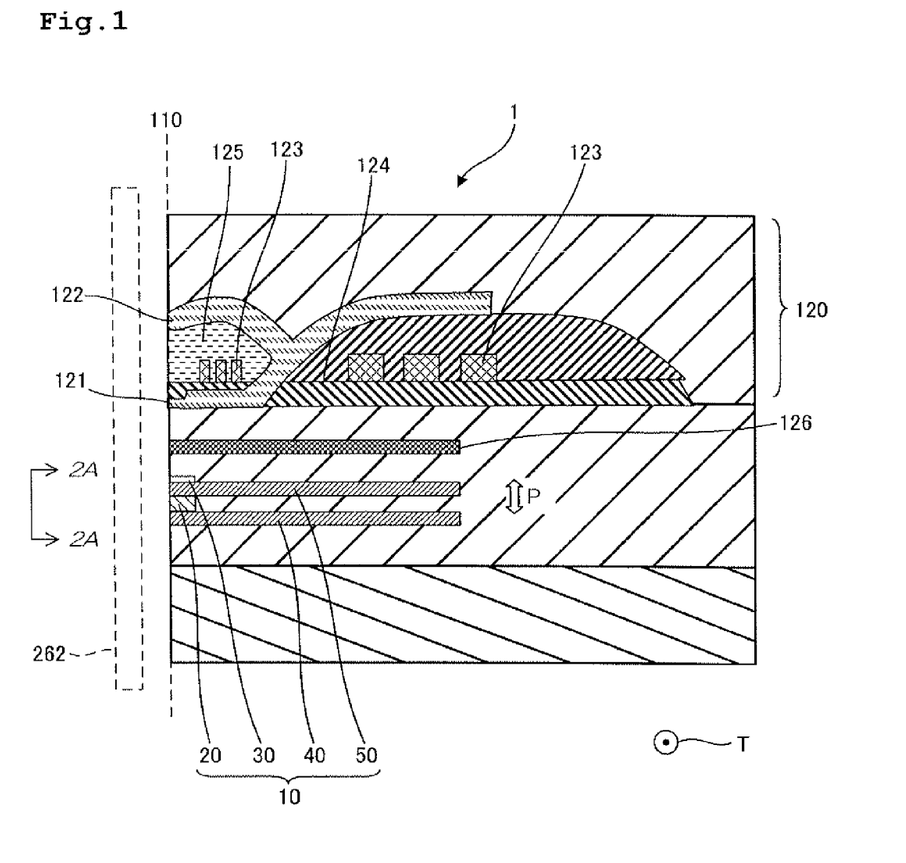
FIG. 1 is a schematic cross-sectional view of a thin film magnetic head including a reading part and a writing part.

FIG. 1 is a schematic cross-sectional view of a thin film magnetic head. A thin film magnetic head 1 is a composite head including a reading element 10 that reads information from a magnetic recording medium and a writing element 120 that writes information to the magnetic recording medium. Instead, the thin film magnetic head can be a reading-exclusive magnetic head including only the reading element 10.

Figure 2:
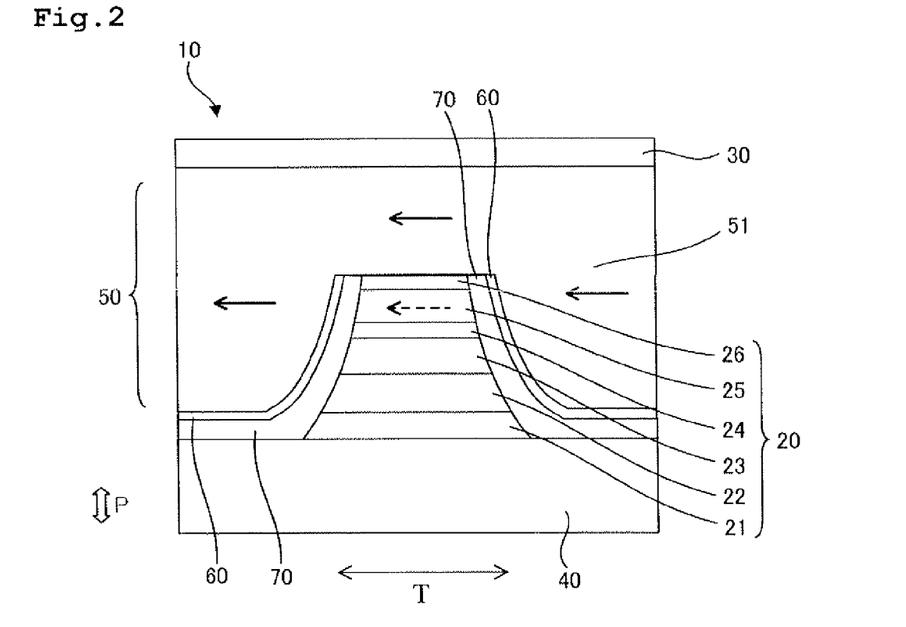
FIG. 2 is a schematic plan view of the reading part of the magnetic head manufactured by a manufacturing method according to one embodiment, as seen from an air bearing surface.

FIG. 2 is a schematic plan view of the reading element 10 of the magnetic head 1, as seen from the 2A-2A direction of FIG. 1, i.e., a surface 110 that faces a recording medium 262. In the magnetic head that reads information of a hard disk, the surface 110 of the magnetic head 1 that faces the recording medium 262 is referred to as an air bearing surface (ABS). Note, in a magnetic head that reads information of a magnetic tape, a surface 110 that faces the recording medium 262 may be referred to as a tape bearing surface.

The reading element 10 includes a magneto resistance effect (MR) element 20 of which an electrical resistance changes according to an external magnetic field and shield layers 40 and 50 that surround the MR element 20. The MR element 20 is arranged in a manner of facing the recording medium 262. The MR element 20 is configured of a multilayer film including a plurality of layers.

The first shield layer 40 is arranged on a lower side in a laminating direction P that is orthogonal to a film surface of the MR element 20, i.e., on a lower side of the multilayer film in a lamination direction P. The second shield layer 50 is arranged so as to cover an upper side of the MR element 20 in the lamination direction P and both sides of the MR element 20.

The first shield layer 40 and the second shield layer 50 function as electrodes that apply voltage to the MR element 20 and that let a sense current flow in the lamination direction P of the MR element 20. A magnetic field of the recording medium 262 at a position of facing the MR element 20 changes in correspondence with the movement of the recording medium 262. When the MR element 20 detects the change of this magnetic field as a change of an electrical resistance, the magnetic head 1 reads magnetic information written in each of the magnetic domains of the recording medium 262.

The first shield layer 40 can be configured with a magnetic layer composed of NiFe, CoFe, NiCoFe, FeSiAl or the like and has a thickness of, for example, approximately 1 μm. The second shield layer 50 includes a soft magnetic layer 51 that covers both sides of the MR element 20 in a track width direction T and an upper side of the MR element 20 in an integrated manner. For the soft magnetic layer 51, NiFe, CoFe, NiCoFe or the like, for example, can be used.

Insulating layers 70 are disposed between the MR element 20 and the second shield layer 50 and between the first shield layer 40 and the second shield layer 50. The insulating layers 70 can be formed of $Al_2O_3$ or the like. It is preferred that protective films 60, which are described below, are formed on the insulating layers 70.

On the opposite side of the MR element 20 with respect to the second shield layer 50, an anisotropy application layer 30 is disposed. For the anisotropy application layer 30, an antiferromagnetic layer composed of IrMn, PtMn, RuRdMn, FeMn or the like or a hard magnetic layer composed of CoPt, CoCrPt, FePt or the like can be used.

The anisotropy application layer 30 provides exchange anisotropy to the soft magnetic layer 51 configuring the second shield layer 50 so as to magnetize the soft magnetic layer 51 in a predetermined direction. The solid arrows in FIG. 2 illustrate one example of the magnetization direction of the soft magnetic layer 51 configuring the second shield layer.

The soft magnetic layer 51 obtains the function that applies a bias magnetic field to the MR element 20, in particular to a free layer 25, when the soft magnetic layer 51 is magnetized in the predetermined direction. The dotted arrow in FIG. 2 illustrates one example of the direction of a bias magnetic field applied to the free layer 25 of the MR element 20.

Also, a magnetic field applied to both sides of the MR element 20 in the track width direction T is effectively absorbed by the soft magnetic layer 51 that covers the both sides and upper side of the MR element 20 in an integrated manner. With such a structure, the function that shields a magnetic field on the both sides of MR element in the track width direction T is maintained.

The magnetic head 1 of the present invention can use an arbitrary MR element 20 including the free layer 25 that is to be formed as a single magnetic domain by a bias magnetic field. A description regarding one example of a configuration of the MR element is given hereinafter. In the example illustrated in FIG. 2, an MR element 20 is a spin valve including a buffer layer 21, a pinning layer 22, a pinned layer 23, a spacer layer 24, a free layer 25 and a cap layer 26. The pinned layer 23 is a ferromagnetic layer of which a magnetization direction is pinned against an external magnetic field. The free layer 25 is a ferromagnetic layer of which a magnetization direction changes according to an external magnetic field.

The buffer layer 21 is disposed as a base of the pinning layer 22. The buffer layer 21 is configured with a Ta layer, a NiCr layer or a multilayer film of Ta and Ru. The pinning layer 22 is disposed so as to pin a magnetization direction of the pinned layer 23. The pinning layer 22 includes an antiferromagnetic layer such as IrMn, PtMn, RuRdMn, FeMn or the like.

For the pinned layer 23, a multilayer film in which, for example, CoFeB, Ru, CoFe or the like are layered can be used. For the free layer 25, a multilayer film of CoFe and NiFe, for example, is used. The second shield layer 50 applies a bias magnetic field to the free layer 25 such that the magnetization of the free layer 25 is oriented in a predetermined direction when there is no external magnetic field.

The magnetization direction of the free layer 25 rotates according to an external magnetic field and forms an angle with respect to the magnetization direction of the pinned layer 23. Depending on the angle between the magnetization direction of the free layer 25 and the magnetization direction of the pinned layer 23, an electrical resistance of the MR element 20 changes. The magnetic head 1 detects the change of the electrical resistance and reads magnetic information of the recording medium.

The spacer layer 24 is disposed so as to increase a separation between the free layer 25 and the pinned layer 23. For the spacer 24, various materials, such as Cu, AlOx, MgO or the like, can be used. It is preferred that the spacer layer is a nonmagnetic layer; however, the spacer layer is not limited to the nonmagnetic layer. The cap layer 26 is disposed to prevent the deterioration of each laminated layer. The cap layer 26 can be configured with a multilayer film of Ru and Ta, or the like.

Figure 3:
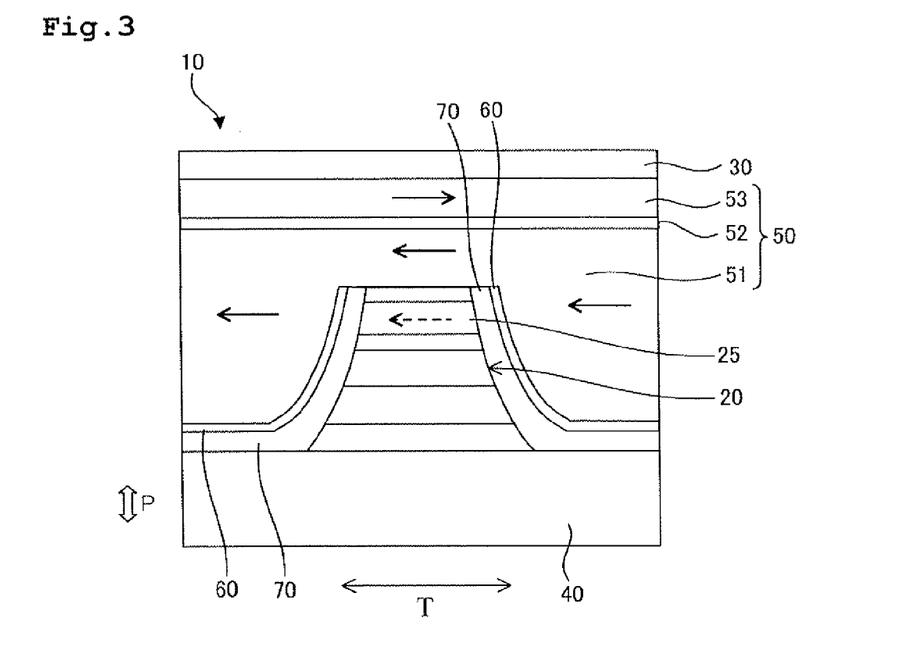
FIG. 3 is a schematic plan view of a reading part of another magnetic head manufactured by a manufacturing method according to one embodiment, as seen from the air bearing surface.
Figure 4:
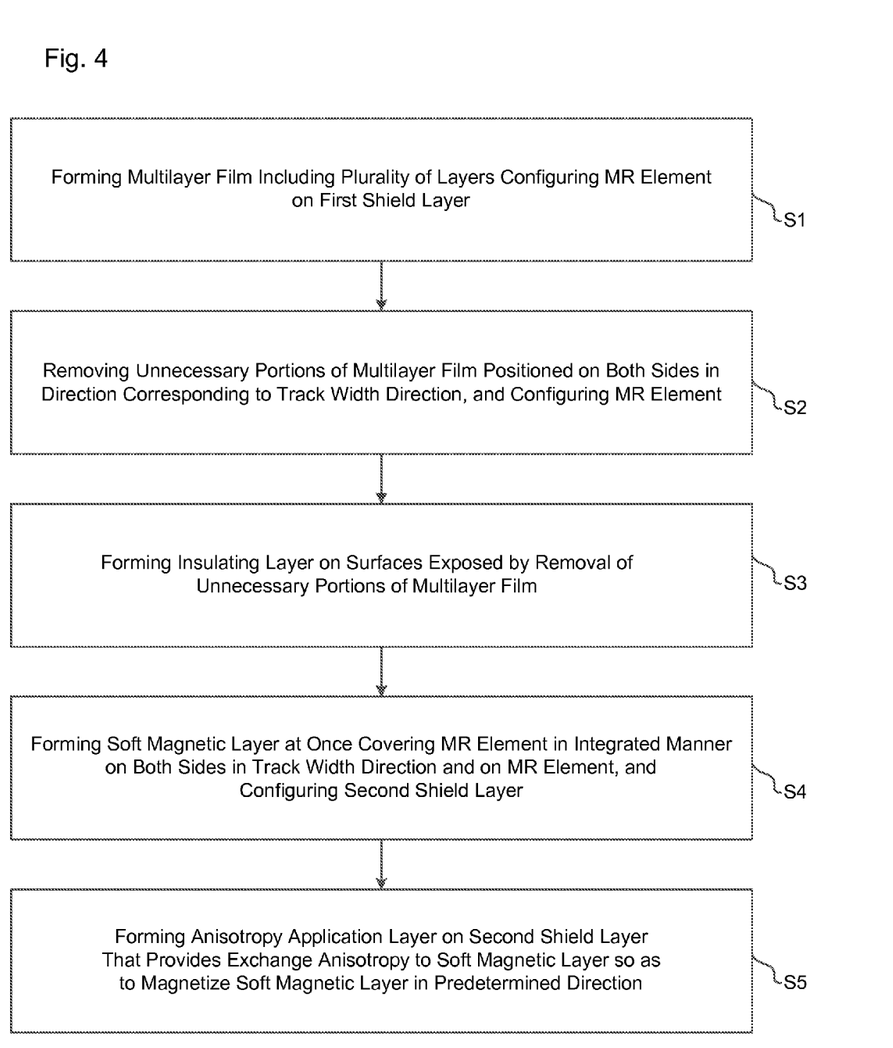
FIG. 4 is a flow diagram illustrating a method of manufacturing the magnetic head.

FIG. 3 is a schematic plan view of a reading element 10 of a magnetic head having another configuration, as seen from the 2A-2A direction of FIG. 1, i.e., the surface 110 that faces the recording medium 262. Since the MR element 20, the first shield layer 40, the insulating layers 70 and the protective films 60 of the magnetic head illustrated in FIG. 3 are the same as the corresponded parts of the magnetic head illustrated in FIG. 2, its explanation is omitted.

In FIG. 3, a second shield layer 50 includes a first soft magnetic layer 51, a second soft magnetic layer 53 and a magnetic coupling layer 52. The first soft magnetic layer 51 covers both sides of the MR element 20 in the track width direction T and an upper side in the lamination direction P.

The magnetic coupling layer 52 is disposed between the first soft magnetic layer 51 and the second soft magnetic layer 53. The magnetic coupling layer 52 is composed of a nonmagnetic layer such as, for example, Ru, Rh, Cr, Cu, Ag or the like. The first soft magnetic layer 51 is exchange-coupled with the second soft magnetic layer 53 with the magnetic coupling layer 52 therebetween. For the first soft magnetic layer 51 and the second soft magnetic layer 53, NiFe, CoFe, NiCoFe or the like, for example, can be used.

The anisotropy application layer 30 is disposed on the second soft magnetic layer 53. The anisotropy application layer 30 provides exchange-anisotropy to the second soft magnetic layer 53 and magnetizes the second soft magnetic layer 53 in a predetermined direction. Because the first soft magnetic layer 51 is antiferromagnetically or ferromagnetically exchange-coupled with the second soft magnetic layer 53, the first soft magnetic layer 51 also is magnetized in a predetermined direction. Note, the solid arrows in FIG. 3 illustrate one example of the magnetization directions of the soft magnetic layers 51 and 53 configuring the second shield layer 50.

Due to the magnetization of the first soft magnetic layer 51, the first soft magnetic layer 51 obtains the function that applies a bias magnetic field to the MR element 20. The dotted arrow in FIG. 3 illustrates one example of the orientation of a bias magnetic field applied to the free layer 25 of the MR element 20.

In FIG. 3, the second shield layer 50 includes one magnetic coupling layer 52 and two soft magnetic layers 51 and 53; however, the second shield layer 50 may include a plurality of magnetic coupling layers and three or more of soft magnetic layers.

Next, a description regarding a method of manufacturing the above-described magnetic head 1 is given with reference to FIG. 4 and FIGS. 5A-5G. FIGS. 5A-5G illustrate cross sections of a wafer along a surface that is to be a surface ABS facing the recording medium 262.

First, the first shield layer 40 is formed on a wafer by, for example, a plating method. Then, as illustrated in FIG. 5A, a multilayer film 20a including a plurality of layers configuring the MR element is formed on the first shield layer 40 (S1).

Figure 5A:
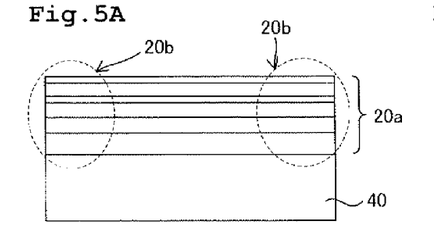
FIG. 5A-FIG. 5G are process drawings illustrating manufacturing processes of the magnetic head.

In an example illustrated in FIG. 5A, the multilayer film 20a is formed on the first shield layer 40 by a sputtering. The multilayer film 20a includes the above-described buffer layer 21, pinning layer 22, pinned layer 23, spacer layer 24, free layer 25 and cap layer 26 (see also FIG. 5B). A film configuration of the multilayer film 20a is arbitrarily variable depending on a configuration of an MR element that is to be manufactured.

Figure 5B:
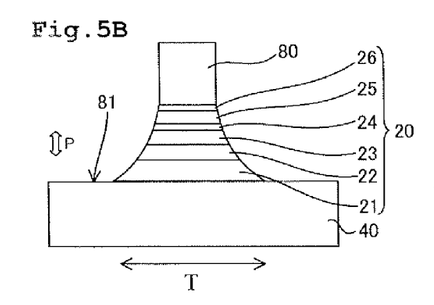

Next, unnecessary portions 20b of the multilayer film, positioned on both sides in a first direction T that is orthogonal to the lamination direction P of the multilayer film 20a and that is parallel to the surface ABS facing the magnetic recording medium, are removed so as to configure an MR element 20 having a predetermined size (S2). The first direction T corresponds to the track width direction.

As one specific example, as illustrated in FIG. 5B, a resist 80 having a predetermined pattern is formed on the multilayer film 20a, and then the unnecessary portions 20b of the multilayer film are removed using the resist 80 as a mask. With such a way, the MR element 20 having the predetermined size is configured.

The resist 80 can be formed by, for example, a photo lithography method. The resist 80 can be either a positive type or a negative type. The unnecessary portions 20b can be removed by an etching method such as a dry etching, a wet etching or the like. The resist 80 can be composed of any material as long as the material has an etching resistance.

Figure 5C:
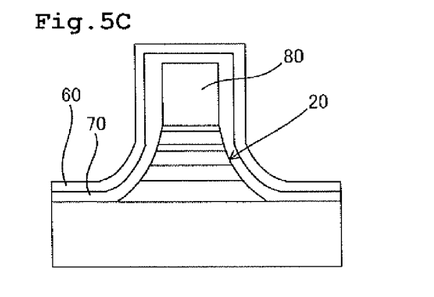

Next, as illustrated in FIG. 5C, on a surface 81 that is exposed by the removal of the unnecessary portions 20b of the multilayer film, an insulating layer 70 is formed by, for example, a sputtering method (S3). The insulating layer 70 is composed of $Al_2O_3$ as one example. It is preferred that the insulating layer 70 has sufficiently thinner film thickness than the film thickness of the MR element 20.

Figure 5D:
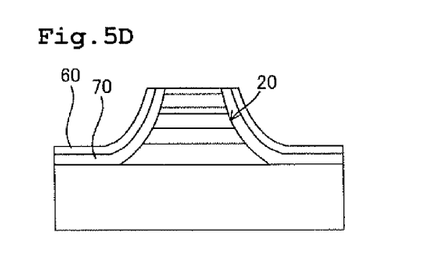

Further, when the resist 80 is used to remove the unnecessary portions 20b of the multilayer film, it is preferred to form a protective film 60 on the insulating layer 70 and then remove the resist 80 by a lift off method (see FIG. 5D). The resist 80 is removed by a resist stripping material. The protective film 60 has a resistance to the resist stripping material.

As a resist stripping agent, an organic solution agent that dissolves the resist 80 can be used. A material of the organic solution agent is arbitrarily selected depending on a material of the resist 80. If the resist stripping agent is an organic solution agent, it is preferred that the protective film 60 is a metal having a resistance to this organic solution agent. Such a metal is at least one material selected from, for example, ruthenium, tantalum, chromium and cobalt.

If there is no protective film 60, the resist stripping agent may dissolve the insulating layer 70. The protective film 60 protects the insulating layer 70 from the resist stripping material, and prevents an erosion of the insulating layer. Thereby, because of the erosion of the protective film by the resist stripping material, it is possible to prevent the occurrence of a short circuit between the first shield layer 40 and the second shield layer 50.

Figure 5E:
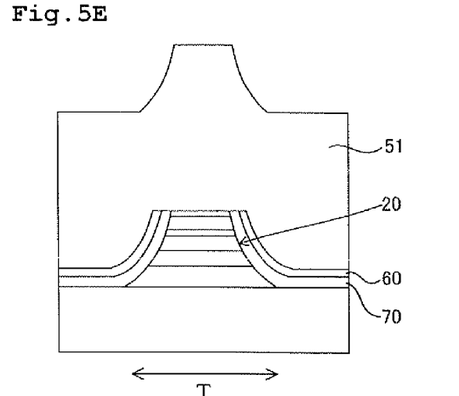

Next, as illustrated in FIG. 5E, a soft magnetic layer 51 that covers the MR element 20 in an integrated manner is formed at once on both sides in the track width direction T and an upper side of the MR element 20 and the insulating layers 70 (S4). The soft magnetic layer 51 can be formed by, for example, a sputtering method. Then, as needed, a chemical mechanical polishing (CMP) is performed on a surface of the soft magnetic layer 51 and the surface of the soft magnetic layer 51 is planarized (see FIG. 5F). With such a way, the first shield layer 50 as illustrated in FIG. 2 is configured.

Figure 5F:
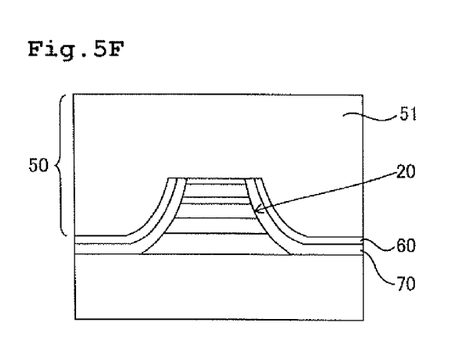

In order to configure the first shield layer 50 including a plurality of soft magnetic layers 51 and 53 as illustrated in FIG. 3, all to be required is to accumulate the magnetic coupling layer 52 and the second soft magnetic layer 53 that is exchange-coupled with the soft magnetic layer 51 with the magnetic coupling layer 52 therebetween above the soft magnetic layer 51 illustrated in FIG. 5F. With such a way, the second shield layer as illustrated in FIG. 3 is configured.

Figure 5G:
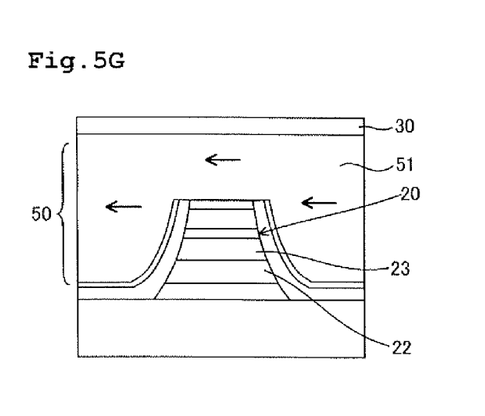

Next, as illustrated in FIG. 5G, the anisotropy application layer 30 that provides exchange anisotropy to the soft magnetic layer 51 so as to magnetize the soft magnetic layer 51 in the predetermined direction is formed on the second shield layer 50 (S5). For the anisotropy application layer 30, an antiferromagnetic layer composed of IrMn, PtMn, RuRdMn, FeMn or the like or a hard magnetic layer composed of CoPt, CoCrPt, FePt or the like can be used.

After the formation of the anisotropy application layer 30, the soft magnetic layer 51 is magnetized in the predetermined direction by an annealing treatment in a magnetic field oriented in a predetermined direction. Accordingly, the second shield layer 50 including the soft magnetic layer 51 obtains the function that applies a bias magnetic field to the MR element 20.

The magnetization direction of the soft magnetic layer 51 configuring the second shield layer 50 is oriented in a direction parallel to a bias magnetic field that is applied to the free layer 25 of the MR element. The direction of the bias magnetic field is preferably a direction parallel to the track width direction T.

In the above-described step S4, since the soft magnetic layer 51 is formed at once, a center portion of the soft magnetic layer 51 does not contact to air for a long time. Therefore, no oxide film is generated in the center portion of the soft magnetic layer 51.

When the oxide film is generated inside the soft magnetic layer 51, exchange anisotropy from the anisotropy application layer 30 may not be sufficiently provided to portions of the soft magnetic layer on both sides of the MR element 20. In this case, the magnetizations in the portions on the both sides of the MR element 20 become unstable, so that the bias function of the second shield layer 50 is decreased. The decrease in the bias function is one factor to cause the Barkhausen noise.

Since no oxide film is formed in the soft magnetic layer 51 in the present manufacturing method, sufficient exchange anisotropy is applied to the portions of the soft magnetic layer on the both sides of the MR element 20, and the strength and/or direction of the bias magnetic field applied to the MR element 20 are/is improved.

Also, a magnetic field applied to both sides of the MR element 20 in the track width direction T is effectively absorbed by the soft magnetic layer 51 that covers the both sides and upper side of the MR element 20. Accordingly, the function that shields a magnetic field on the both sides of MR element 20 in the track width direction T is maintained.

As described above, the reading element 10 of the magnetic head 1 is manufactured. After that, it is necessary that a writing element 120, which is explained below, is formed above the reading element 10 as necessary. After the formation of the writing element 120, a wafer on which MR elements are formed is cut into bars, and an air bearing surface 110 is formed by a polishing. Moreover, the bar is divided into sliders, processes such as washing, examination or the like are performed, and thereby a slider, which is described below, is completed.

Next, a detail description regarding a configuration of the writing element 120 is give with reference to FIG. 1. The writing element 120 is disposed above the reading element 10 with an interelement shield 126, being formed by a sputtering method or the like, therebetween. The writing element 120 has a configuration for so-called perpendicular magnetic recording. A magnetic pole layer for writing is formed with a main magnetic pole layer 121 and an auxiliary magnetic pole layer 122. These magnetic pole layers 121 and 122 are formed by a frame plating method or the like. The main magnetic pole layer 121 is formed of FeCo and is exposed in an orientation nearly orthogonal to the air bearing surface 110 on the air bearing surface 110. A coil layer 123 extending over a gap layer 124 composed of an insulating material is wound around the periphery of the main magnetic pole layer 121 so that a magnetic flux is induced to the main magnetic pole layer 121 by the coil layer 123. The coil layer 123 is formed by a frame plating method or the like. The magnetic flux is guided into the inside of the main magnetic pole layer 121 and extends from the air bearing surface 110 towards the recording medium 262. The main magnetic pole layer 121 is squeezed not only in the film surface orthogonal direction P but also in the track width direction T (a sheet surface orthogonal direction in FIG. 1) near the air bearing surface 110 to generate a minute and strong write magnetic field in accordance with the high recording density.

The auxiliary magnetic pole layer 122 is a magnetic layer magnetically coupled with the main magnetic pole layer 121. The auxiliary magnetic pole layer 122 is a magnetic pole layer with a film thickness between approximately 0.01 μm and approximately 0.5 μm and is formed of an alloy composed of two or three of any of Ni, Fe, Co or the like. The auxiliary magnetic pole layer 122 is disposed in a manner of branching from the main magnetic pole layer 121 and faces the main magnetic pole layer 121 with the gap layer 124 and a coil insulating layer 125 therebetween on the air bearing surface 110 side. The end part of the auxiliary magnetic pole layer 122 on the air bearing surface 110 side forms the trailing shield part in which the layer cross-section is wider than other parts of the auxiliary magnetic pole layer 122. The magnetic field gradient between the auxiliary magnetic pole layer 122 and the main magnetic pole layer 121 becomes steeper in the vicinity of the air bearing surface 110 by providing this type of auxiliary magnetic pole layer 122. As a result, the signal output jitter is reduced, and the error rate during reading can be lowered.

Figure 6:
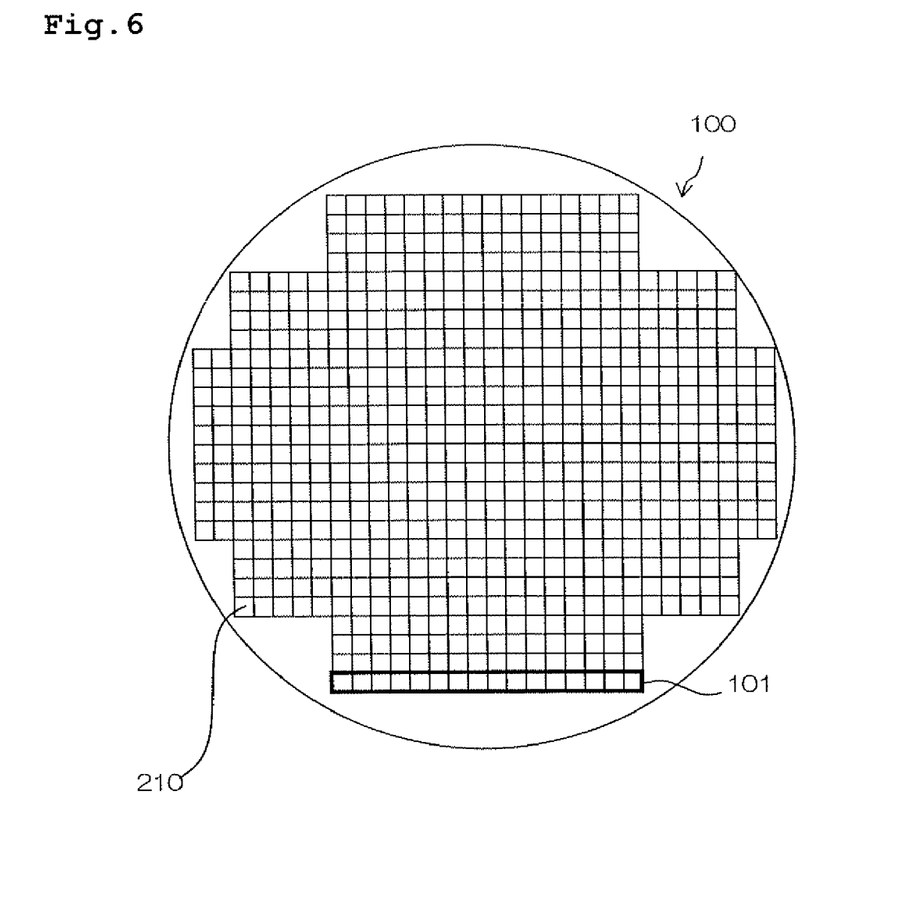
FIG. 6 is a plan view of a wafer in related to the manufacture of the magnetic head.

Next, a description is given regarding a wafer that is used for manufacturing the above-described magnetic head. Referring to FIG. 6, multilayer films that configure at least the above-described magnetic heads are formed on a wafer 100. The wafer 100 is divided into a plurality of bars 101 that are an operational unit for performing a polishing process onto the air bearing surface. Further, the bar 101 is cut after the polishing process and is divided into sliders 210 each including the thin film magnetic head. In the wafer 100, a cut margin (not shown) for cutting the wafer 100 into the bar 101 and the bar 101 into the slider 210 is disposed.

Figure 7:
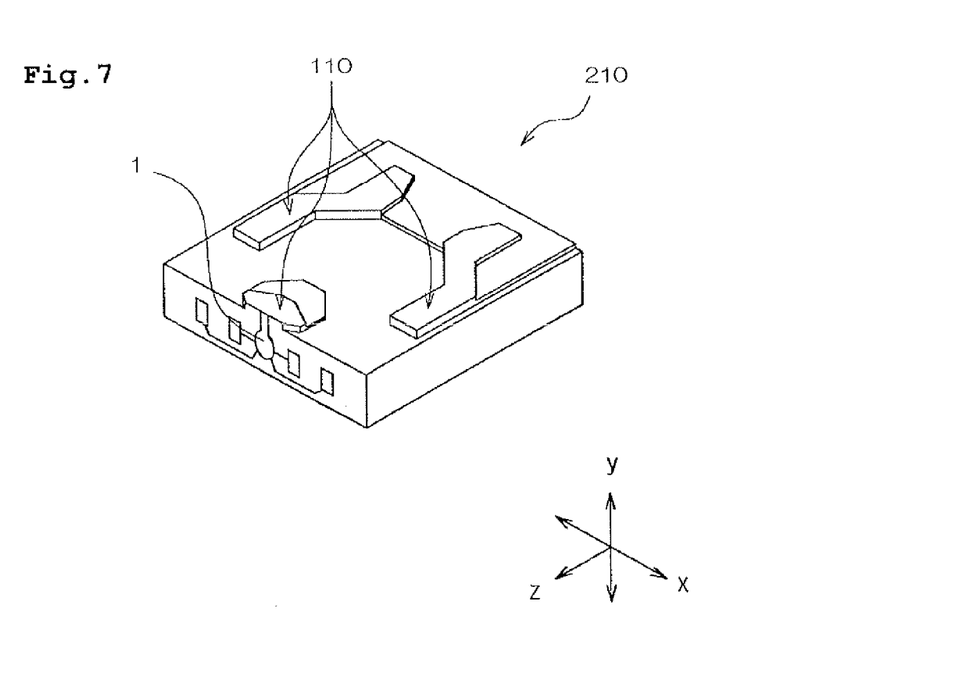
FIG. 7 is a perspective view of a slider.

Referring to FIG. 7, a slider 210 has a substantially hexahedral shape, and one surface of the six outer surfaces is the air bearing surface 110 that faces a hard disk.

Figure 8:
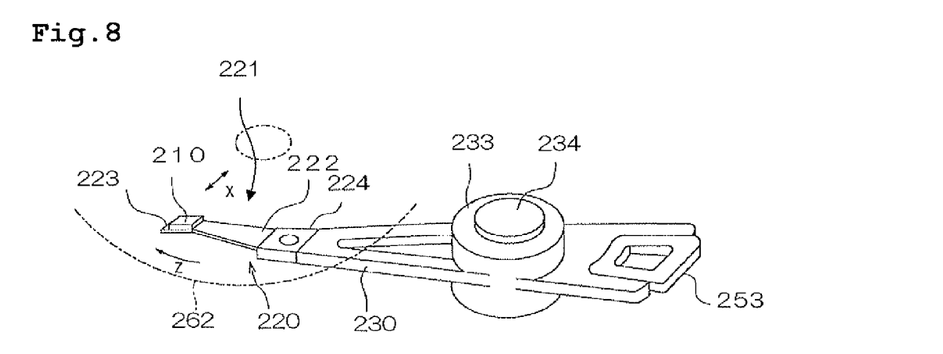
FIG. 8 is a perspective view of a head arm assembly including a head gimbal assembly in which a slider is integrated.

Referring to FIG. 8, a head gimbal assembly 220 includes the slider 210 and a suspension 221 elastically supporting the slider 210. The suspension 221 includes a load beam 222, a flexure 223 and a base plate 224. The load beam 222 is formed of stainless steel in a plate spring shape. The flexure 223 is arranged in one edge part of the load beam 222. The base plate 224 is arranged in the other edge part of the load beam 222. The slider 210 is joined to the flexure 223 to give the slider 210 suitable flexibility. At the part of the flexure 223 to which the slider 210 is attached, a gimbal part is disposed to maintain the slider 210 in an appropriate orientation.

The slider 210 is arranged in the hard disk device so as to face the hard disk, which is a disk-shaped recording medium 262 that is rotatably driven. When the hard disk rotates in the z-direction of FIG. 8, air flow passing between the hard disk and the slider 210 generates a downward lifting force to the slider 210. The slider 210 flies above the surface of the hard disk due to the lifting force. In the vicinity of the edge part of the slider 210 (edge part in bottom left of FIG. 7) on the air flow exit side, the thin film magnetic head 1 is formed.

An assembly in which the head gimbal assembly 220 is mounted to an arm 230 is referred to as a head arm assembly. The arm 230 moves the slider 210 in the track width direction x of a hard disk 262. One edge of the arm 230 is attached to the base plate 224. To the other edge of the arm 230, a coil 253 that forms one part of a voice coil motor is attached. A bearing part 233 is disposed in the middle part of the arm 230. The arm 230 is rotatably supported by a shaft 234 attached to the bearing part 233. The arm 230 and the voice coil motor for driving the arm 230 configure an actuator.

Figure 9:
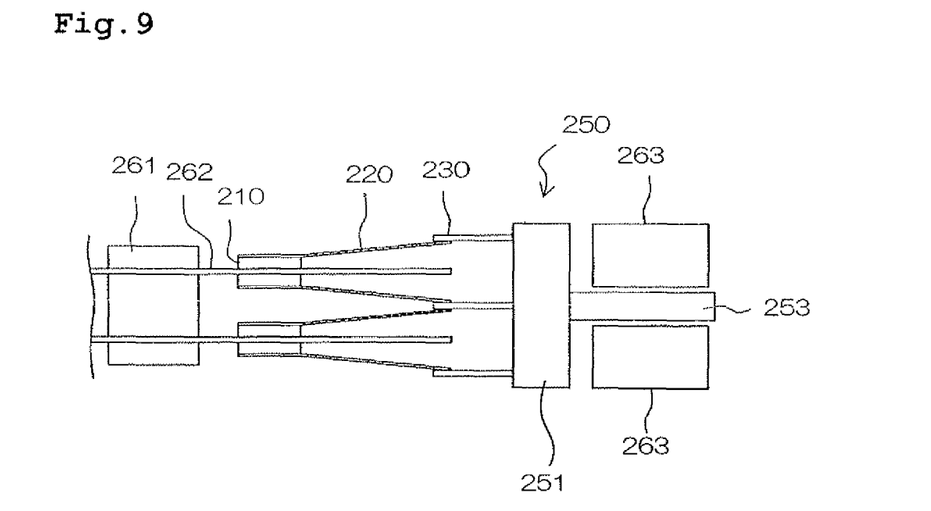
FIG. 9 is a side view of a head arm assembly in which the slider is integrated.
Figure 10:
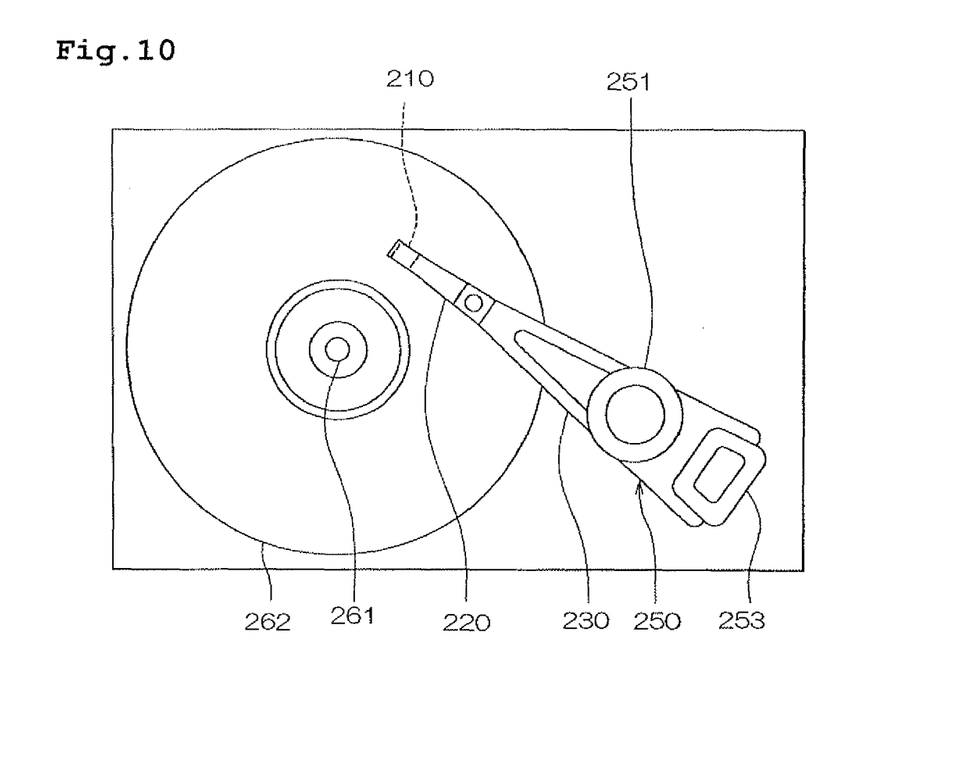
FIG. 10 is a plan view of the hard disk device in which the slider is integrated.

Next, referring to FIGS. 9 and 10, the description is given with regard to a head stack assembly in which the above-described slider is integrated, and the hard disk device. The head stack assembly is an assembly in which the head gimbal assembly 220 is attached to each arm of a carriage including a plurality of the arms. FIG. 9 is a side view of the head stack assembly, and FIG. 10 is a plan view of the hard disk device. The head stack assembly 250 includes a carriage 251 including a plurality of arms 230. On each of the arms 230, the head gimbal assembly 220 is attached such that the head gimbal assemblies 220 align mutually at an interval in the vertical direction. On the side of the carriage 251, which is the opposite side to the arm 230, a coil 253 is mounted to be a part of the voice coil motor. The voice coil motor includes permanent magnets 263 arranged so as to sandwich the coil 253 and to face each other.

Referring to FIG. 10, the head stack assembly 250 is integrated in the hard disk device. The hard disk device includes multiple hard disks 262 attached to a spindle motor 261. For each of the hard disks 262, two sliders 210 are arranged in a manner of sandwiching the hard disk 262 and facing each other. The head stack assembly 250 except for the slider 210 and the actuator corresponds a positioning device of the present invention, supports the slider 210, and positions the slider 210 with respect to the hard disk 262. The slider 210 is moved in the track width direction of the hard disk 262 by the actuator, and is positioned with respect to the hard disk 262. The thin film magnetic head 1 included in the slider 210 records information to the hard disk 262 with the writing element, and reproduces information recorded on the hard disk 262 with the reading element.

While preferred embodiments of the present invention have been shown and described in detail, and it is to be understood that variety of changes and modifications may be made without departing from the spirit of scope of the following claims or its scope.

What is claimed is:

1. A method of manufacturing a magnetic head that includes a magneto resistance effect (MR) element of which an electrical resistance changes according to an external magnetic field and shield layers surrounding the MR element, and that reads information of a magnetic recording medium, comprising:
   a first step of forming a multilayer film including a plurality of layers configuring the MR element on a first shield layer;
   a second step of removing unnecessary portions of the multilayer film on both sides of the MR element in a first direction that is orthogonal to a lamination direction of the multilayer film and that is parallel to a plane that is to be a surface facing the magnetic recording medium so as to configure the MR element;
   a third step of forming an insulating layer on a surface exposed by removing the unnecessary portions;
   a fourth step of forming an integrated soft magnetic layer covering both sides of the MR element in the first direction and the insulating layer thereon, and covering an upper side of the MR element, thereby configuring a second shield layer including the soft magnetic layer; and
   a fifth step of forming an anisotropy application layer on the second shield layer, the anisotropy application layer providing exchange anisotropy to the soft magnetic layer so as to magnetize the soft magnetic layer in a predetermined direction.

2. The method of manufacturing the magnetic head according to claim 1, wherein
   in the second step, a resist having a predetermined pattern is formed on the multilayer film and the unnecessary portions of the multilayer film are removed using the resist as a mask, and
   between the third step and the fourth step, a protective film having a resistance to a resist stripping material is formed on the insulating layer and then the resist is removed by the resist stripping material.

3. The method of manufacturing the magnetic head according to claim 2, wherein
   the resist stripping material is an organic solution agent that resolves the resist, and
   the protective film is a metal having a resistance to the organic solution agent.

4. The method of manufacturing the magnetic head according to claim 3, wherein
   the protective film is composed of at least one material selected from a group consisting of ruthenium, tantalum, chromium and cobalt.

5. The method of manufacturing the magnetic head according to claim 1, wherein
   the anisotropy application layer is an antiferromagnetic layer or a hard magnetic layer.

6. The method of manufacturing the magnetic head according to claim 5, wherein
when the anisotropy application layer is the antiferromagnetic layer, the antiferromagnetic layer is composed of one of IrMn, PtMn, RuRdMn, and FeMn, and
when the anisotropy application layer is the hard magnetic layer, the hard magnetic layer is composed of one of CoPt, CoCrPt, and FePt.

7. The method of manufacturing the magnetic head according to claim 1, wherein
after the fifth step, the soft magnetic layer is magnetized in a predetermined direction by an annealing treatment in a magnetic field oriented in a predetermined direction.

8. The method of manufacturing the magnetic head according to claim 1, wherein
the MR element is a spin valve film including a pinned layer of which a magnetization direction is pinned against the external magnetic field, a free layer of which a magnetization direction changes according to the external magnetic field, a spacer layer disposed between the pinned layer and the free layer, and a pinning layer including an antiferromagnetic layer that pins the magnetization direction of the pinned layer.

9. A method of manufacturing the magnetic head according to claim 1, wherein
in the fourth step, after forming the soft magnetic layer, a magnetic coupling layer, which is nonmagnetic, is formed on the soft magnetic layer, another soft magnetic layer that is exchange-coupled with the soft magnetic layer with the magnetic coupling layer therebetween is formed so that the second shield layer including these soft magnetic layers is configured.

10. The method of manufacturing the magnetic head according to claim 1, wherein
the first and second shield layers are electrodes that apply voltage to the MR element and that let a sense current flow to the MR element along the lamination direction.

11. The method of manufacturing the magnetic head according to claim 1, wherein
a thickness of the insulating layer is less than a thickness of the multilayer film.

12. The method of manufacturing the magnetic head according to claim 11, wherein
the insulating layer is composed of $Al_2O_3$.

13. The method of manufacturing the magnetic head according to claim 1, wherein
the fourth step of forming a soft magnetic layer is performed by a sputtering process, and
and between the fourth step and the fifth step, the surface of the soft magnetic undergoes a chemical mechanical polishing, thereby planarizing the soft magnetic layer.

* * * * *